United States Patent [19]
Kawai

[11] Patent Number: 5,220,176
[45] Date of Patent: Jun. 15, 1993

[54] APPARATUS AND METHOD FOR DETECTING ALIGNMENT MARKS HAVING ALIGNMENT OPTICAL SYSTEMS' DRIVING MEANS

[75] Inventor: Hidemi Kawai, Kawasaki, Japan
[73] Assignee: Nikon Corporation, Tokyo, Japan
[21] Appl. No.: 941,176
[22] Filed: Sep. 4, 1992

[30] Foreign Application Priority Data
Sep. 13, 1991 [JP] Japan ................................... 3-234671

[51] Int. Cl.[5] ................................................ G01N 21/86
[52] U.S. Cl. ...................................... 250/548; 356/401
[58] Field of Search ............... 250/548, 557, 560, 561, 250/201.3, 492.2; 356/399, 400, 401

[56] References Cited
U.S. PATENT DOCUMENTS

| | | | |
|---|---|---|---|
| 4,402,596 | 9/1983 | Kanatani | 355/43 |
| 4,616,130 | 10/1986 | Omata | 356/401 |
| 4,636,626 | 1/1987 | Hazama et al. | 250/201 |
| 4,669,867 | 6/1987 | Uda et al. | 356/400 |
| 4,710,029 | 12/1987 | Katoh | 356/401 |

*Primary Examiner*—David C. Nelms
*Assistant Examiner*—Que T. Le
*Attorney, Agent, or Firm*—Shapiro and Shapiro

[57] ABSTRACT

The apparatus is of the type which detects alignment marks formed on a mask and aligns the mask. The apparatus includes: a plurality of alignment optical systems to detect the plurality of alignment marks formed on the mask in predetermined detection areas; driving means for moving at least a part of the plurality of alignment optical systems in accordance with an arrangement of the alignment marks; and a projecting optical system to project a pattern on the mask onto a photosensitive substrate. In the apparatus, the relative positional relations among the detection areas of the plurality of alignment optical systems on the projection image plane of the projecting optical system are detected, and the position of the detection area of at least one of the plurality of alignment optical systems is corrected independent of the driving means so that the detected relative positional relations are set to predetermined positional relations.

7 Claims, 3 Drawing Sheets

APPARATUS AND METHOD FOR DETECTING ALIGNMENT MARKS HAVING ALIGNMENT OPTICAL SYSTEMS' DRIVING MEANS

BACKGROUND OF THE INVENTION

1. Field of the Invention

The invention relates to an alignment apparatus and, more particularly, to an alignment optical system of a projection type exposing apparatus to manufacture a semiconductor device.

2. Related Background Art

The alignment optical system of such a kind of conventional alignment apparatus has a construction as shown in FIG. 5. That is, a microscope objective section 1 to detect images of marks $X_1$ and $Y_1$ is arranged at the position corresponding to an area on a mask (reticle) 17 in which alignment marks $X_1$ and $Y_1$ are arranged. The images of the alignment marks $X_1$ and $Y_1$ detected by the objective section 1 are respectively projected to an X-axis detecting section 4 and a Y-axis detecting section 6 each of which is constructed by a photodetector or the like through the alignment optical system including an optical path divider such as a half mirror 3 and the like (only the half mirror 3 is shown in the diagram).

The X-axis and Y-axis detecting sections 4 and 6 have slits 5 and 7 of the shapes which substantially coincide with the shapes of the alignment marks $X_1$ and $Y_1$. The reticle 17 is aligned by setting the alignment mark $X_1$ and slit 5 into a predetermined positional relation and by setting the alignment mark $Y_1$ and slit 7 into a predetermined positional relation. With respect to the other alignment marks $X_2$ and $Y_2$ on the reticle as well, the images detected by a microscope objective section 8 are respectively projected to an X-axis detecting section 11 and a Y-axis detecting section 13 and the alignment marks $X_2$ and $Y_2$ and the slits 12 and 14 are set into predetermined positional relations, thereby aligning the reticle in a manner similar to the above method.

In U.S. Pat. No. 4,710,029, there is disclosed a method whereby reference marks formed on a stage onto which a wafer is put are used, one of the slits in the alignment optical system and the reference mark are made coincide through a projection objective lens, and the stage is moved after that, thereby adjusting the alignment optical system so that the reference mark and other slits in the alignment optical system coincide through the projection objective lens. Particularly, there is disclosed an apparatus for optically correcting a rotational error of the alignment optical system for the moving direction of the stage due to a fluctuation of a projection magnification.

In recent years, however, there is a tendency such that a chip area of semiconductor device is more and more increasing. An enlargement of an exposure area which is needed on the reticle is required. In association with the enlargement of the exposure area, it is necessary to change the arrangement of the alignment marks on the reticle. In accordance with the manufacturing steps of the semiconductor device, there is also a case where a plurality of kinds of exposure areas of the reticles are used for one apparatus. Each time the kind of reticle is changed, the arrangement of the alignment marks differs.

In the conventional apparatus with the construction as mentioned above, however, since the alignment optical system is fixed to the apparatus, the use of the reticles with different exposure areas (namely, the positions of the alignment marks are different) is limited.

An alignment apparatus of a construction such that (a whole or a part of) the alignment optical system is made movable has been disclosed in U.S. Pat. No. 4,402,596 or 4,636,626. A method of optically correcting a mechanical position deviation in association with the movement of the alignment optical system has been disclosed in U.S. Pat. No. 4,636,626.

However, a method of detecting the positional relations among a plurality of alignment optical systems through the projection objective lens is not disclosed in U.S. Pat. Nos. 4,402,596 and 4,636,626. The positional relations among a plurality of alignment optical systems cannot be changed and set to predetermined values.

SUMMARY OF THE INVENTION

It is an object of the invention to solve the problems as mentioned above and to provide an alignment apparatus which can uniform alignment precisions of reticles even when a plurality of kinds of reticles of different arrangements of alignment marks are exchanged and used.

Another object of the invention is to provide an alignment apparatus which can correct position setting errors of a plurality of alignment optical systems.

Still another object of the invention is to increase the number of kinds of reticles which can be used in one exposing apparatus and to realize a high accurate alignment which is not influenced by a positioning precision of a driving section when the position of an objective section of an alignment optical system is changed.

To accomplish the above objects, according to the invention, there is provided an alignment apparatus comprising a projection optical system to project a pattern on a mask onto a photo sensitive substrate, a plurality of alignment optical systems to detect a plurality of alignment marks formed on the mask in predetermined detection areas, and driving means for enabling at least a part of the alignment optical systems to be moved in accordance with an arrangement of the alignment marks, wherein the apparatus further comprises: detecting means for detecting relative positional relations on the projection image planes of the projection optical system in the detection areas of the plurality of alignment optical systems after completion of the movement by the driving means; and correcting members for correcting the position of the detection area of at least one of the plurality of alignment optical systems irrespective of the driving means in a manner such that the detected relative positional relations are set to positional relations on design.

DETAILED DESCRIPTION OF THE PREFERRED EMBODIMENTS

Figure 1:
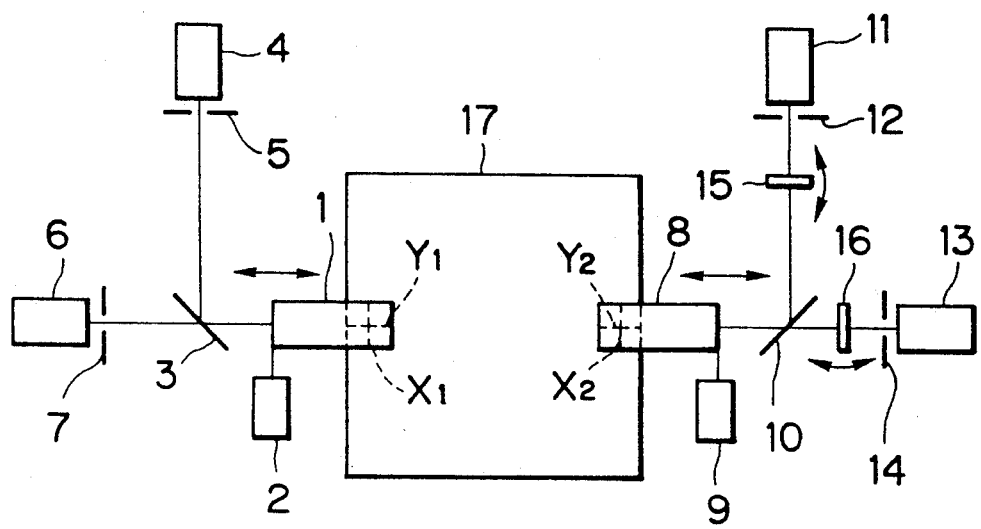
FIG. 1 is a diagram showing a schematic construction of an alignment apparatus according to the first embodiment of the invention.
Figure 5:
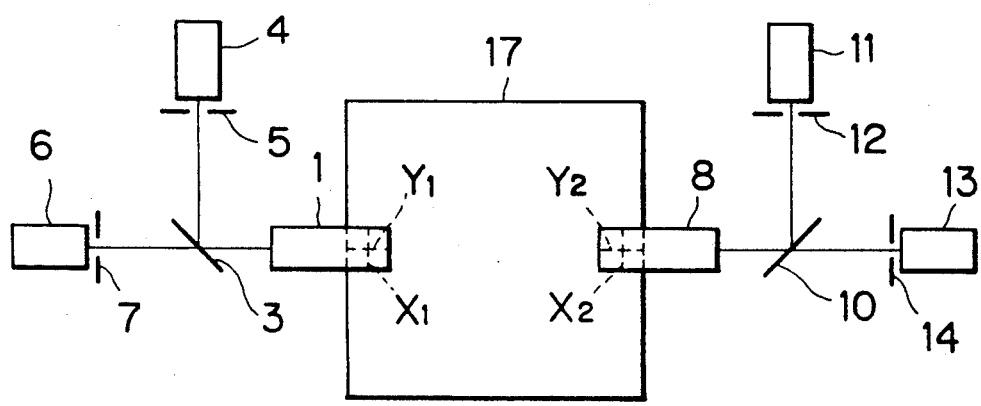
FIG. 5 is a diagram showing a schematic construction of an alignment apparatus according to the prior art.
Figure 6:
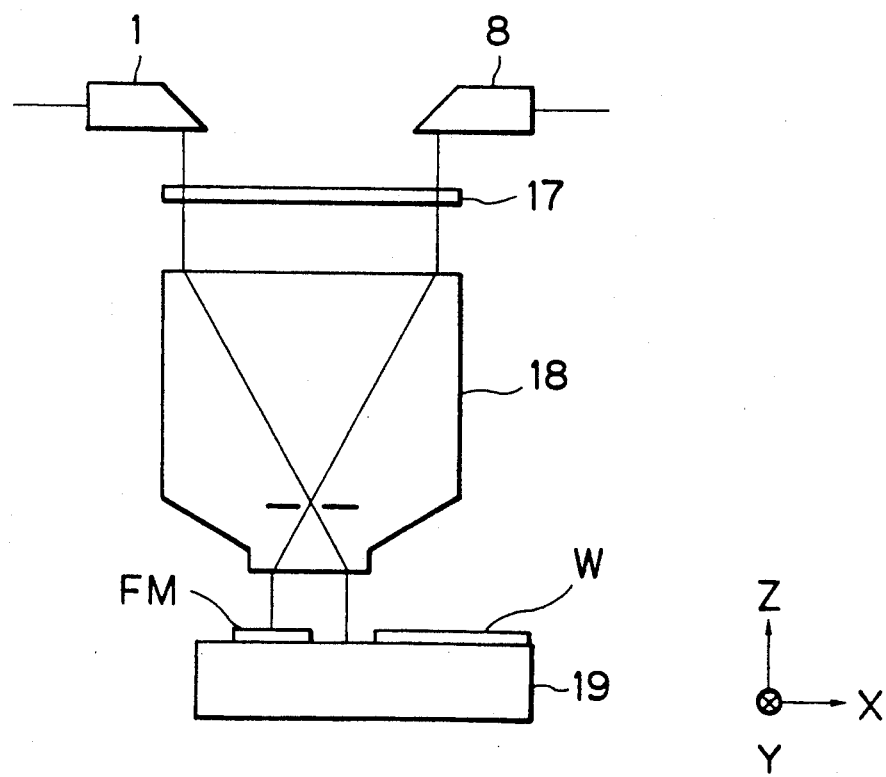
FIG. 6 is a diagram showing a schematic construction of an exposing apparatus having an alignment apparatus.

FIG. 1 is a diagram showing a schematic construction of an alignment optical system according to the first embodiment of the invention. The fundamental construction is similar to that of the conventional apparatus shown in FIGS. 5 and 6. The embodiment has novel points such that the microscope objective sections 1 and 8 of the alignment optical systems are provided with driving sections 2 and 9 to move the microscope objective sections 1 and 8, respectively, and that parallel flat plate glasses 15 and 16 as optical members to change an optical path are provided in one of a plurality of alignment optical systems. That is, the objective sections 1 and 8 are moved by the driving sections 2 and 9 in a manner such that in association with the change in arrangement of the alignment marks $X_1$, $Y_1$, $X_2$, and $Y_2$ on the reticle 17, the alignment marks $X_1$, $Y_1$, $X_2$, and $Y_2$ are located in the detection areas of the objective sections 1 and 8, namely, in the visual field on the reticle 17 of the objective sections 1 and 8, respectively. FIG. 6 shows an exposing apparatus having the alignment optical system. An image of a reticle pattern formed on the reticle 17 is formed onto a wafer W through a projecting optical system 18. The wafer W is put on a wafer stage 19 which can be two-dimensionally moved in the directions of X and Y. Since the objective sections 1 and 8 are of the movable type, a position setting precision as a reference of alignment causes a problem. That is, since the objective sections are moved, the relative positional relations in the visual fields of the objective sections, that is, on the projection image planes of the projecting optical system 18 of slits 5, 7, 12, and 14 as alignment references in the alignment optical systems are deviated from predetermined relations. Although the slits have been used as alignment references in the embodiment, in an apparatus of a construction such that the alignment is executed by image processes, it is sufficient to use a visual field in which such an image is derived as a detection area. In case of executing the alignment by using a laser beam or the like, it is sufficient to use an irradiating range of the laser beam as a detection area. A method of correcting such a positional deviation will now be described hereinbelow.

A reference marker plate FM having a reference plane is put on the wafer stage 19 of an exposing apparatus having such a kind of alignment apparatus so as to be located in substantially the same plane as the photosensitive surface of the wafer as shown in FIG. 6. A pattern (not shown) extending in the two-dimensional directions similar to the alignment markers $X_1$, $Y_1$, $X_2$, and $Y_2$ on the reticle is drawn as a reference pattern on the reference plane of the reference marker plate FM. The foregoing positional deviation is corrected by using the reference pattern and the parallel flat plate glasses 15 and 16 shown in FIG. 1.

First, the reference marker plate FM is moved to the position on the projection image plane of the projecting optical system 18 corresponding to the position at which the microscope objective section 1 has been moved (namely, to the position in the moving range of the stage 19). It is sufficient to move the plate FM in accordance with the positions on design of the alignment marks $X_1$ and $Y_1$ on the reticle 17. The reference pattern on the marker plate FM is now detected by the objective section 1 through the projecting optical system and the plate FM is moved, thereby aligning to the positions of the slits 5 and 7. The position of the marker plate FM (reference pattern) in this instance is measured by position measuring means such as an interferometer or the like provided for the wafer stage and is stored. The position of the detection area of the objective section 1 on the projection image plane of the projecting optical system 18 is obtained by the above method.

When the position of the detection area of the objective section 1 on the projection image plane of the projecting optical system 18 is obtained, the reference marker plate FM is moved to the position on the projection image plane of the projecting optical system 18 corresponding to the position at which the detection area of the objective section 8 should exist (position in the moving range of the stage 19) on the basis of the positions on design of the alignment marks $X_2$ and $Y_2$ on the reticle 17. In this instance, the reference pattern of the marker plate FM at the moved position doesn't coincide with the slits 12 and 14 of the alignment optical system including the objective section 8. Therefore, the parallel flat plate glasses 15 and 16 arranged in the optical path of the alignment optical system are rotated and the optical path is changed (shifted), thereby making the reference pattern coincide with the slits 12 and 14. An error occurring due to the movement of the objective sections 1 and 8 can be corrected by the above operations.

As mentioned above, since the correcting members to correct the position of the detection area in the alignment optical system are provided for the alignment apparatus, the relative position among the detection areas of the alignment optical systems can be finely adjusted.

Figure 2:
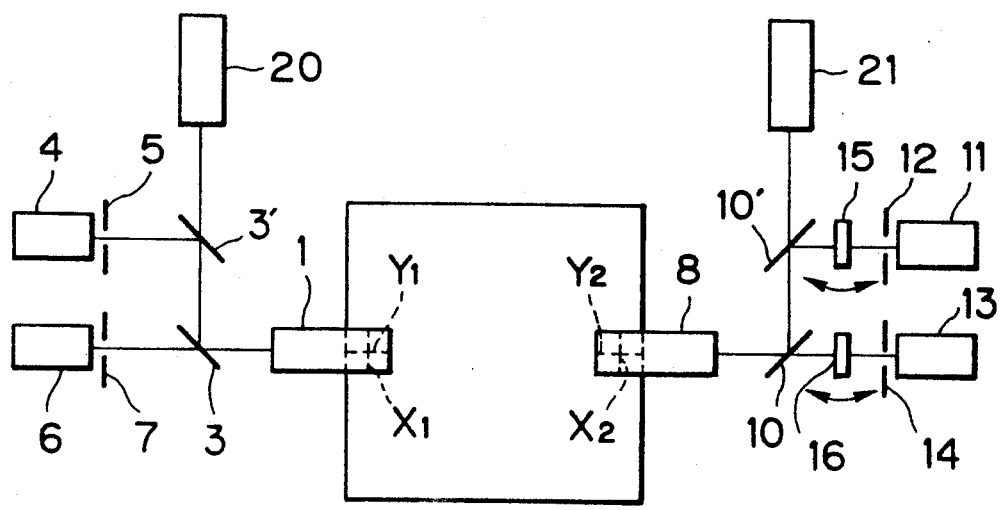
FIG. 2 is a diagram showing a schematic construction of an alignment apparatus according to the second embodiment of the invention.
Figure 3:
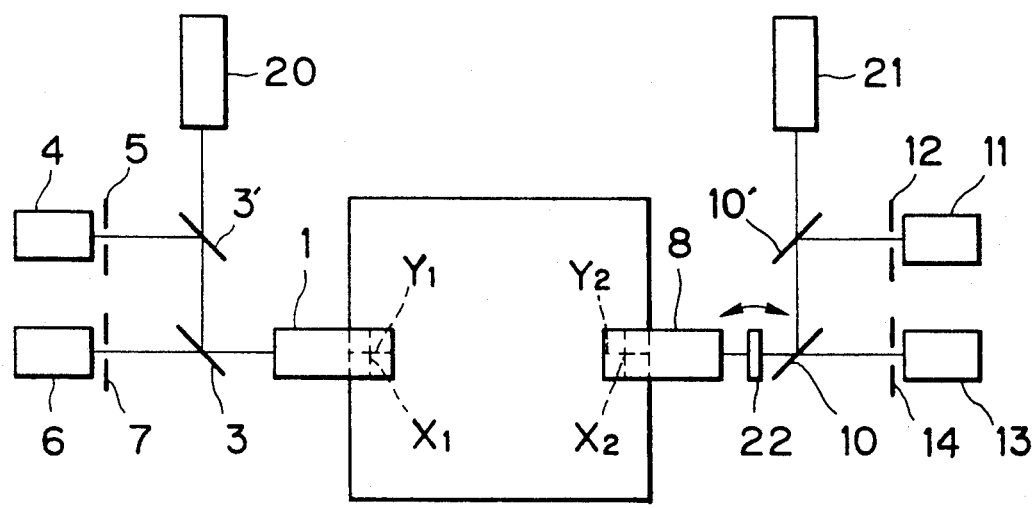
FIG. 3 is a diagram showing a schematic construction of an alignment apparatus according to the third embodiment of the invention.

Generally, in such a kind of alignment apparatus, for example, an observing system including an image pickup tube and the like is provided in order to observe the alignment marks on a monitor such as a CRT or the like. Therefore, an example of an apparatus having such an observing system will now be described as a second embodiment with reference to FIG. 2. An arrangement of the optical system of the alignment apparatus shown in FIG. 2 is fundamentally similar to that shown in FIG. 1. Optical path dividers 3' and 10' such as half mirrors or the like are added and the optical paths are led to observing systems 20 and 21, respectively. In this case, the optical paths which reach the X-axis detecting section 11 and Y-axis detecting section 13 can be corrected by the parallel flat plate glasses 15 and 16. In the second embodiment, the optical path which reaches the observing system 21 cannot be corrected by the parallel flat plate glasses 15 and 16. Namely, the positional relation between the images of the alignment marks $X_2$ and $Y_2$ in the X-axis and Y-axis detecting sections 11 and 13 which have been corrected by the parallel flat plate glasses 15 and 16 cannot be directly observed. Therefore, an example in which a parallel flat plate glass is arranged in a common optical path of the observing system and the X-axis and Y-axis detecting sections as shown in FIG. 3 will now be described as a third embodiment. A parallel flat plate glass 22 has rotational axes in the directions which perpendicularly cross each other and corrects optical paths in the X-axis and Y-axis directions. In this case, although the positional relation between the alignment marks $X_2$ and $Y_2$ which are detected by the X-axis and Y-axis detecting sections 11 and 13 can be detected by the observing system 21, when the parallel flat plate glass 22 is rotated in one direction, the rotating state in the other direction is also slightly changed. Since it is difficult to completely eliminate such a change, for instance, after the X-axis direction was corrected, when the Y-axis direction is corrected, the correcting state in the X-axis direction is not maintained. In the worst case, consequently, the correcting operation is repeated many times. Even if the correction in each of the X-axis and Y-axis directions is not performed for one parallel flat plate glass but is individually corrected for two independent parallel flat plate glasses, the same result will be derived so long as the arranging positions of the two parallel flat plate glasses is similar to that shown in FIG. 3.

Figure 4:
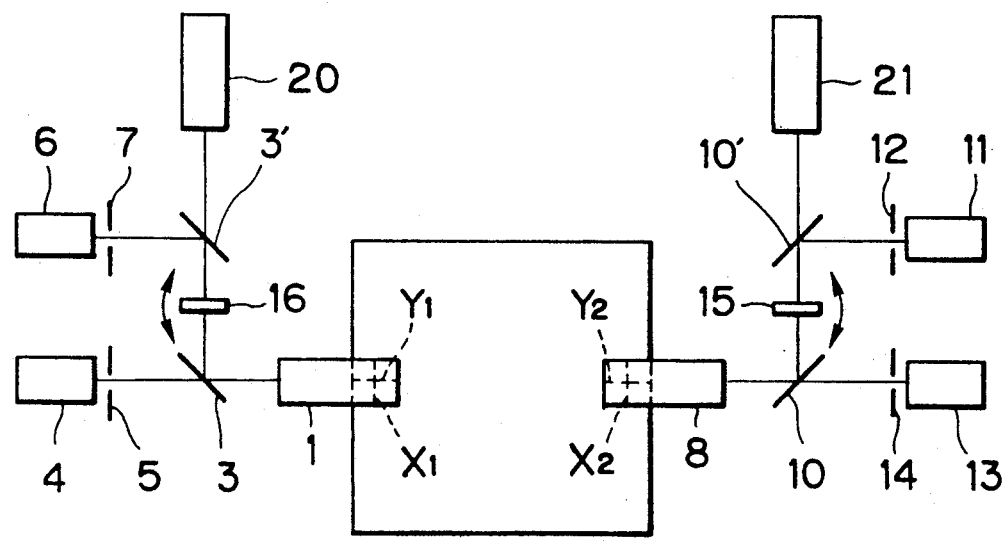
FIG. 4 is a diagram showing a schematic construction of an alignment apparatus according to the fourth embodiment of the invention.

The arrangement of the parallel flat plate glasses to solve the problem in the embodiments shown in FIGS. 2 and 3 will now be described as a fourth embodiment with reference to FIG. 4. That is, in the fourth embodiment, for example, only the correction in the X-axis direction is executed by one of a plurality of alignment optical systems and the correction in the Y-axis direction is performed by another optical system. Namely, the parallel flat plate glass 16 is arranged in the optical paths which reach the Y-axis detecting section 6 and observing system 20 among the optical paths divided by the half mirror 3 (optical paths after the optical path was divided to the X-axis detecting section 4) in the optical path of the alignment optical system including the microscope objective section 1. On the other hand, the parallel flat plate glass 15 is arranged in the optical paths which reach the X-axis detecting section 11 and observing system 21 among the optical paths divided by the half mirror 10 (optical paths after the optical path was divided to the Y-axis detecting section 13) in the optical path of the alignment optical system including the microscope objective section 8. In the alignment optical system of the above construction, the position of the image of the alignment mark $X_2$ which is detected by the X-axis detecting section 11 is corrected by the parallel flat plate glass 15, and the position of the image of the alignment mark $Y_1$ which is detected by the Y-axis detecting section 6 is corrected by the parallel flat plate glass 16. A fine adjustment of the interval between the alignment marks $X_1$ and $X_2$ is executed by rotating the parallel flat plate glass 15 by using the alignment mark $X_1$ which has been aligned to the X-axis detecting section 4 as a reference. The parallel alignment in the Y coordinate direction of the alignment marks $Y_1$ and $Y_2$ is performed by rotating the parallel flat plate glass 16 by using the alignment mark $Y_2$ which has been aligned to the Y-axis detecting section 13 as a reference. Therefore, the corrections in the X-axis direction and Y-axis direction are independently executed and their correcting states can be monitored by the observing systems 21 and 20, respectively.

In each of the above embodiments, the illumination to detect each alignment mark is not described in particular. However, it is possible to use a method of illuminating from the alignment optical system side or a method of illuminating from the marker plate side by using a light emitting type plate as a reference marker plate FM.

What is claimed is:

1. An alignment apparatus for detecting alignment marks formed on a mask and for aligning said mask, comprising:
    a plurality of alignment optical systems for detecting said plurality of alignment marks formed on said mask in predetermined detection areas;
    driving means for moving at least one of said plurality of alignment optical systems in accordance with an arrangement of said alignment marks;
    a projecting optical system for projecting a pattern on the mask onto a photosensitive substrate;
    detecting means for detecting relative positional relations of said detection areas of said plurality of alignment optical systems on a projection image plane of said projecting optical system; and
    correcting means for correcting the position of the detection area of at least one of said plurality of alignment optical systems independent of said driving means so that said relative positional relations are set to predetermined positional relations.

2. An apparatus according to claim 1, wherein said correcting means is a rotatable parallel flat plate glass and corrects the position of the detection area by shifting an optical path of said alignment optical system.

3. An apparatus according to claim 1, wherein said correcting means corrects the position of the detection area so that the relative positional relations are set to positional relations on design.

4. An apparatus according to claim 1, wherein at least one of said plurality of alignment optical systems has a first alignment optical system to detect the first alignment mark in which a first direction is set to a measuring direction and a second alignment optical system to detect the second alignment mark in which a second direction is set to a measuring direction,
    said correcting means is arranged on each of an optical path of said first alignment optical system and an optical path of said second alignment optical system, and said two correcting means independently execute the correction in the first direction and the correction in the second direction.

5. An apparatus according to claim 1, wherein said plurality of alignment optical systems have a first alignment optical system to detect the first alignment mark in which a first direction is set to a measuring direction and a second alignment optical system to detect the second alignment mark in which a second direction is set to a measuring direction and has observing systems for observing said first and second alignment marks,
    said correcting means is arranged on each of an optical path of the first alignment optical system and an optical path of the second alignment optical system, said correcting means independently executes the correction in the first direction and the correction in the second direction, and said observing systems can individually confirm the correction in the first direction and the correction in the second direction.

6. An apparatus according to claim 1, wherein at least one of said plurality of alignment optical systems has a first alignment optical system to detect the first alignment mark in which a first direction is set to a measuring direction and a second alignment optical system to detect the second alignment mark in which a second direction is set to a measuring direction,
    and said correcting means has two correction members which are arranged in a synthetic optical path of an optical path of the first alignment optical system and an optical path of the second alignment optical system and independently execute a correction in the first direction and the correction in the second direction.

7. An alignment method of detecting a plurality of alignment marks formed on a mask and aligning the mask by using an alignment apparatus having a plurality of alignment optical systems to detect the plurality of alignment marks formed on the marks in predetermined detection areas and a projecting optical system to project a pattern on the mask onto a photosensitive substrate, comprising the steps of:

moving at least a part of said plurality of alignment optical systems in accordance with an arrangement of said alignment marks;

detecting relative positional relations of detection areas of said plurality of alignment optical systems on a projection image plane of said projecting optical system after completion of the movement; and correcting the position of the detection area of at least one of said plurality of alignment optical systems independent of said movement so that the relative positional relations are set to predetermined positional relations.

* * * * *